(12) United States Patent
Vak et al.

(10) Patent No.: US 11,881,361 B2
(45) Date of Patent: Jan. 23, 2024

(54) PHOTOVOLTAIC APPARATUS AND METHOD

(71) Applicant: Commonwealth Scientific and Industrial Research Organisation, Australian Capital Territory (AU)

(72) Inventors: Doojin Vak, Victoria (AU); Karl Weber, Victoria (AU); Andrew Faulks, Victoria (AU); Régine Chantler, Victoria (AU)

(73) Assignee: Commonwealth Scientific and Industrial Research Organisation, Australian Capital Territory (AU)

( * ) Notice: Subject to any disclaimer, the term of this patent is extended or adjusted under 35 U.S.C. 154(b) by 95 days.

(21) Appl. No.: 16/630,834

(22) PCT Filed: Jul. 13, 2018

(86) PCT No.: PCT/AU2018/050729
§ 371 (c)(1),
(2) Date: Jan. 13, 2020

(87) PCT Pub. No.: WO2019/010542
PCT Pub. Date: Jan. 17, 2019

(65) Prior Publication Data
US 2020/0143995 A1    May 7, 2020

(30) Foreign Application Priority Data

Jul. 14, 2017  (AU) .................................. 2017902769

(51) Int. Cl.
*H01L 31/05*   (2014.01)
*H01G 9/20*    (2006.01)
(Continued)

(52) U.S. Cl.
CPC ......... *H01G 9/2081* (2013.01); *H01G 9/0036* (2013.01); *H01G 9/2009* (2013.01);
(Continued)

(58) Field of Classification Search
CPC .. H01G 9/2081; H01G 9/0036; H01G 9/2009; H01G 9/2095; H01L 31/0201;
(Continued)

(56) References Cited

U.S. PATENT DOCUMENTS 8,759,664 B2   6/2014   Kanto et al.
8,802,973 B2   8/2014   Kim
(Continued)

FOREIGN PATENT DOCUMENTS

EP   1547158 B1   11/2007
JP   S60-17941 A   1/1985
(Continued)

OTHER PUBLICATIONS

Extended European Search Report dated Mar. 3, 2021 in corresponding European Application No. 1831022.1, 13 pages.
(Continued)

*Primary Examiner* — Michael Y Sun

(57) ABSTRACT

The invention is directed to a photovoltaic apparatus comprising a carrier substrate. The carrier substrate carries printed structures comprising: a plurality of photovoltaic modules, each module including first and second terminals and a plurality of photovoltaic cells electrically connected between the first and second module terminals; a first bus bar extending along one side of the photovoltaic modules; a second bus bar extending along an opposite side of the photovoltaic modules; and a plurality of intermodule rails, each inter-module rail being associated with a photovoltaic module. The apparatus includes a plurality of selectively configurable junctions, one or more of the junctions being (Continued)

configurable to enable a photovoltaic module to be selectively connected to or disconnected from an adjacent photovoltaic module via one or more inter-module rails, and/or enable a module terminal to selectively connect with or disconnect from one of the first and second bus bars, such that the photovoltaic modules can be selectively electrically connected in series and/or parallel on demand.

17 Claims, 16 Drawing Sheets

(51) Int. Cl.
*H01G 9/00* (2006.01)
*H01L 31/02* (2006.01)
*H01L 31/0384* (2006.01)
*H01L 31/0392* (2006.01)
*H01L 31/18* (2006.01)
*H10K 30/30* (2023.01)
*H10K 71/13* (2023.01)
*H10K 71/60* (2023.01)
*H10K 77/10* (2023.01)

(52) U.S. Cl.
CPC ....... *H01G 9/2095* (2013.01); *H01L 31/0201* (2013.01); *H01L 31/03845* (2013.01); *H01L 31/03926* (2013.01); *H01L 31/0504* (2013.01); *H01L 31/1876* (2013.01); *H10K 30/30* (2023.02); *H10K 71/13* (2023.02); *H10K 71/611* (2023.02); *H10K 77/111* (2023.02)

(58) Field of Classification Search
CPC ......... H01L 31/03845; H01L 31/03926; H01L 31/0504; H01L 31/1876; H01L 51/0004; H01L 51/0022; H01L 51/0097; H01L 51/4253; H01L 31/046; H01L 51/441; H01L 31/05; H01L 31/02002; H01L 31/0445; H01L 31/02167; H01L 31/18; Y02P 70/50; H02S 40/36; H02S 30/20; Y02E 10/542; Y02E 10/549
See application file for complete search history.

(56) References Cited

U.S. PATENT DOCUMENTS

| | | | |
|---|---|---|---|
| 2008/0142071 A1* | 6/2008 | Dorn | H02S 30/20 136/245 |
| 2009/0079412 A1 | 3/2009 | Kuo | |
| 2012/0006378 A1* | 1/2012 | Kanto | H01L 31/0504 156/227 |
| 2016/0035924 A1 | 2/2016 | Oraw et al. | |
| 2016/0285024 A1* | 9/2016 | Carbonera | H01L 51/441 |

FOREIGN PATENT DOCUMENTS

| | | |
|---|---|---|
| JP | H03-19379 A | 1/1991 |
| JP | 2013-510427 A | 3/2013 |
| WO | 2013-152952 A1 | 10/2013 |

OTHER PUBLICATIONS

Dhere, "Toward GW/year of CIGS production within the next decade," Solar Energy Materials & Solar Cells 91 (2007) 1376-1382.
Krebs, "Fabrication and processing of polymer solar cells: A review of printing and coating techniques," Solar Energy Materials & Solar Cells 93 (2009( 394-412).
Notification of Transmittal of the International Preliminary Report on Patentability dated Oct. 8, 2019, 4 pages.
International Search Report and Written Opinion dated Sep. 17, 2018, 12 pages.
"Notice of Reasons for Rejection," dated May 16, 2022 in corresponding Japanese Patent Application No. 2020-501182, including English translation, 6 pages.

* cited by examiner 202    204

PHOTOVOLTAIC APPARATUS AND METHOD

CROSS-REFERENCE TO RELATED APPLICATIONS

This application is a national stage entry from International Application No. PCT/AU2018/050729, filed on Jul. 13, 2018, published as International Publication No. WO 2019/010542 A1 on Jan. 17, 2019, and claims priority under 35 U.S.C. § 119 from Australian patent application No. 2017902769, filed on Jul. 14, 2017, the entire contents of all of which are incorporated herein by reference.

FIELD OF THE INVENTION

The present invention relates to photovoltaic apparatus and a method for its manufacture. The apparatus comprises photovoltaic (PV) modules which may be printed on a carrier web or film of a bendable material (herein referred to as a printed solar film (PSF)). Each module may comprise a photovoltaic cell or a plurality of photovoltaic cells connected between positive and negative module terminals. The carrier web or film may also be printed with busbars and/or rails suitable for adaptively or flexibly interconnecting the photovoltaic modules on demand.

BACKGROUND OF THE INVENTION

Prior art photovoltaic cells have been manufactured with inorganic crystalline silicon. Currently the most efficient inorganic solar cells may convert in excess of 40 percent of collected solar energy to electrical energy. However one disadvantage of such inorganic solar cells, including those based on crystalline silicon is that they require large amounts of energy in their manufacture. Moreover the nature of the materials used in inorganic solar cells may require considerable labour and expense for their manufacture.

Accordingly attention has turned to a class of solution processed solar cells including organic solar cells, organic-inorganic hybrid perovskite solar cells and inorganic nano particle based solar cells which are typically fabricated in a module pattern (refer FIG. 1a) along a carrier web via a roll-to-roll process. The module pattern may be repeated along the carrier web and the repeated pattern may be series-connected along a processing direction of the web.

Although the module pattern shown in FIG. 1a may in theory be extended indefinitely, producing striped patterns perpendicular to a processing direction is not practical due to limitations of manufacturing methods. Hence the striped pattern has traditionally been produced parallel to a processing direction.

Therefore, a practical interconnection method was developed as shown in FIGS. 2a and 2b and also described in WO 2013/152952. The method uses an infinite interconnection of cells referred as an "infinity design", to produce a relatively high voltage without suffering ohmic (I2R) losses due to high current from a large cell area. The design may be cut-to-size for a desired application or required voltage output.

Although the "infinity design" is practical and useful, there are limitations in real world applications. For example when an application length is decided, there is little freedom to choose an output voltage as output voltage will typically be determined by module voltage X application length/module length. Thus, when the application length is too long (say >10 m), output voltage may be typically too high to be safe. Moreover as output voltage is usually different depending on application length, design of balance of system (BOS) is challenging as inverters which convert outputs of solar cells to a standard voltage typically have an operating window of input voltage and/or current.

To address the limitations of conventional sheet modules and infinity designs, a more flexible or versatile method of interconnecting photovoltaic modules is desired.

A reference herein to a patent document or other matter which is given as prior art is not to be taken as an admission that that document or matter was known or that the information it contains was part of the common general knowledge as at the priority date of any of the claims.

SUMMARY OF THE INVENTION

According to one aspect of the present invention, there is provided a photovoltaic apparatus comprising a carrier substrate, said carrier substrate carrying printed structures comprising:

a plurality of photovoltaic modules, each module including first and second terminals and a plurality of photovoltaic cells electrically connected between the first and second module terminals;

a first bus bar extending along one side of the photovoltaic modules;

a second bus bar extending along another side of the photovoltaic modules; and a plurality of inter-module rails, each inter-module rail being associated with a photovoltaic module; and wherein the apparatus includes a plurality of selectively configurable junctions, one or more of the junctions being configurable to enable a photovoltaic module to be selectively connected to or disconnected from an adjacent photovoltaic module via one or more inter-module rails, and/or enable a module terminal to selectively connect with or disconnect from one of the first and second bus bars, such that the photovoltaic modules can be selectively electrically connected in series and/or parallel on demand.

According to the present invention, each photovoltaic module includes a plurality of connected photovoltaic cells. Each photovoltaic module can be configured with a predetermined number of photovoltaic cells to provide a predetermined output. The inter-module rails and selectively configurable junctions advantageously allow flexible connection of the photovoltaic modules in any series and/or parallel combination to achieve a desired overall output. It has been found that it is easier to use the junctions to selectively configure the series/parallel connections between the photovoltaic modules rather than connections between individual photovoltaic cells.

Typically, the selective configurable junctions and the selected junction configurations are incorporated into the design of the photovoltaic apparatus during manufacture. In particular, the selectively configurable junctions may be formed together with the photovoltaic modules, inter-module rails and bus bars. This advantageously allows custom designed printed solar film to be produced on demand in a cost effective manner.

The plurality of selectively configurable junctions may include one or more linkable gaps, and/or one or more severable links.

The one or more inter-module rails may be configured to enable selective series connection between adjacent photovoltaic modules; and one or more of the junctions may be configured to enable selective parallel connection between adjacent photovoltaic modules.

The photovoltaic modules may include a first conducting electrode layer, a charge selective layer, and a photoactive layer, wherein each of the layers are formed on the substrate via a coating process.

In one embodiment, at least one junction is a linkable gap associated with an inter-module rail for selectively connecting a first terminal of the associated photovoltaic module to a second terminal of an adjacent photovoltaic module upon application of conductive paste over at least a portion of the linkable gap.

In one embodiment, the photovoltaic apparatus comprises one or more units of modules, each unit including two or more adjacent modules connected in series such that a leading module is disposed at one end of the series connection and a trailing module is disposed at an opposite end of the series connection within each unit, wherein the first terminal of the leading module includes a first junction for selectively connecting said first terminal to said first bus bar, and wherein the second terminal of the trailing module includes a second junction for selectively connecting said second terminal to said second bus bar.

The first terminal of each module may include a first junction for electrically connecting the first terminal to the first bus bar at least when the associated module is a leading module at one end of a unit of modules. The second terminal of each module may include a second junction for electrically connecting the second terminal to the second bus bar at least when the associated module is a trailing module located at another end of said unit of modules.

The or each inter-module rail may include a third junction for electrically connecting a first or second terminal of an associated module to the second or first terminal respectively of the adjacent module at least when the associated module is to be connected in series to the adjacent module.

n modules may be electrically connected in series to form a minor unit of n modules wherein n is an integer. The minor unit of n modules may be repeated along the carrier substrate at least once to form m minor units of n modules each wherein m is an integer. "m" may be an integer greater than or equal to 2. The m minor units of n modules may be electrically connected in parallel to form a major unit of n×m modules.

In one form the carrier substrate may comprise a bendable foil such as metal or plastics.

Each photovoltaic module may comprise a plurality of photovoltaic cells electrically connected in series between the first and second module terminals.

Each inter-module rail may comprise a printed conducting material.

Each first and second bus bar may comprise a printed conducting material, a laminated metal foil or a combination thereof.

The first module terminal may be arranged to have a positive electrical potential relative to the second module terminal. The first bus bar may be arranged to have a positive electrical potential relative to the second bus bar.

The first junction may comprise at least one gap which is electrically linkable between the first module terminal and the first bus bar. The link may be made via a conductive paste, a conductive ink or a conductive tape.

Alternatively the first junction may comprise a severable link between the first module terminal and the first bus bar, the link being maintained at least when the associated module is a leading module at one end of a unit of modules, and said link being severed when the associated module is not a leading module at one end of a unit of modules.

The second junction may comprise at least one gap which is electrically linkable between said second module terminal and said second bus bar, the link being made at least when the associated module is a trailing module located at another end of said unit of modules. The link may be made via a conductive paste, a conductive ink or a conductive tape.

Alternatively the second junction may comprise a severable link between the second module terminal and the second bus bar, the link being maintained at least when the associated module is a trailing module located at another end of the unit of modules, and the link being severed when the associated module is not a trailing module located at another end of the unit of modules.

The third junction may comprise at least one gap which is electrically linkable between the first or second module terminal and the inter-module rail of the adjacent module, said link being made at least when the associated module is to be connected in series to the adjacent module. The link may be made via a conductive paste, a conductive ink or a conductive tape.

Alternatively the third junction may comprise a severable link between said first or second module terminal and the inter-module rail of the adjacent module, said link being maintained at least when the associated module is to be connected in series to the adjacent module, and said link being severed when the associated module is not to be connected in series with the adjacent module.

According to another aspect of the present invention there is provided a photovoltaic apparatus comprising a carrier substrate, said carrier substrate carrying printed structures comprising:

a plurality of units, each unit comprising a plurality of photovoltaic modules, wherein each module comprises first and second terminals, and wherein a plurality of photovoltaic cells are electrically connected between the first and second terminals of a photovoltaic module;

a first bus bar extending along one side of the plurality of units, wherein the first bus bar is adapted to electrically connect to the first terminal of a leading photovoltaic module in a unit;

a second bus bar extending along another side of the plurality of units, wherein the second bus bar is adapted to electrically connect to the second terminal of a trailing photovoltaic module in a unit; and an inter-module rail-associated with each photovoltaic module, wherein said inter-module rail includes a rail junction adapted to selectively connect adjacent photovoltaic modules in series at least when an electrical connection to the first or second bus bar is established through the first or second terminal or to remain disconnected.

According to yet another aspect of the present invention there is provided a photovoltaic apparatus comprising a carrier substrate, said carrier substrate carrying printed structures comprising:

a plurality of units, each unit comprising a plurality of photovoltaic modules, wherein each module comprises first and second terminals, and wherein a plurality of photovoltaic cells is electrically connected between the first and second terminals of a photovoltaic module;

a first bus bar extending along one side of the plurality of units, wherein the first bus bar is adapted to electrically connect to the first terminal of a leading photovoltaic module in a unit;

a second bus bar extending along another side of the plurality of units, wherein the second bus bar is adapted to electrically connect to the second terminal of a trailing photovoltaic module in a unit; and an inter-module rail-associated with each photovoltaic module, and wherein x modules, wherein x is an integer greater than one, are electrically connected in series or, in series and parallel to one another through connected inter-module rails to form a set of photovoltaic modules, and an adjacent inter-module rail including a rail junction adapted to electrically connect an adjacent set of photovoltaic modules when an electrical connection to the first or second bus bar is established through the first or second terminal or to remain disconnected.

The photovoltaic cells may be connected to each other in series. Each photovoltaic cell may comprise a first and second cell electrode, wherein the first electrode has a positive electrical potential relative to the second cell electrode and wherein the first cell electrode of a leading photovoltaic cell in the series forms the first module terminal and the second cell electrode of a trailing photovoltaic cell in the series forms the second module terminal. The photovoltaic apparatus may be printed on demand to provide a selected electrical voltage or current by: selecting the number of cells in a module; and/or selecting the number of modules in a unit.

There is also disclosed herein, a kit of parts comprising a printed photovoltaic apparatus as described above and a conductive material such as a conductive paste, a conductive ink or a conductive tape adapted to make connections between selected first terminals and first bus bar selected second terminals and second bus bar and between rail junctions on demand.

According to still another aspect of the present invention, there is provided a photovoltaic apparatus comprising a carrier substrate, said carrier substrate carrying printed structures comprising:

a plurality of photovoltaic modules wherein each module comprises first and second terminals and wherein a plurality of photovoltaic cells are electrically connected between the first and second module terminals;

a first bus bar extending along one side of the photovoltaic modules;

a second bus bar extending along another side of the photovoltaic modules; and a plurality of inter-module rails wherein each inter-module rail is associated with a photovoltaic module;

wherein the plurality of photovoltaic modules are arranged as one or more units, each unit having a leading module and a trailing module electrically connected to each other or spaced apart by n modules, wherein n is an integer;

wherein the modules are connected in series, or in series and parallel via junctions associated with said inter-module rail; and wherein said first terminal of the leading module is electrically connected to said first bus bar and the second terminal of the trailing module is electrically connected to said second bus bar.

According to another aspect of the invention, there is provided a method of producing a photovoltaic apparatus as described above, wherein the method includes the steps of forming a first conducting electrode layer on the substrate;

forming a first charge selective layer at least partially over the first conducting electrode layer;

forming a photoactive layer at least partially over the first charge selective layer;

forming a second charge selective layer at least partially over the photoactive layer;

wherein one or more of the first conducting electrode layer, the first charge selective layer, the photoactive layer, and the second charge selective layer is formed via a coating process;

removing portions the formed layers at predetermined intervals along the substrate creating discrete layer sections partially forming individual photovoltaic modules; and printing a second conducting electrode layer partially over the discrete layer sections and substrate to form the photovoltaic modules, inter-module rails and bus bars.

According to yet another aspect of the invention, there is provided a method of producing a photovoltaic apparatus as described above, wherein the method includes the step of forming the photovoltaic modules, inter-module rails and bus bars on the substrate, wherein the step of forming includes defining the selectively configurable junctions.

There is also disclosed herein, a method for manufacturing photovoltaic apparatus on a carrier substrate, the method comprising the steps of:

providing said carrier substrate;

printing a plurality of photovoltaic modules on said substrate wherein each module comprises first and second terminals and wherein one or more photovoltaic cells is electrically connected between said first and second module terminals;

printing a first bus bar extending along said carrier substrate and flanking the photovoltaic modules on one side;

printing a second bus bar extending along said carrier substrate and flanking the photovoltaic modules on the other side;

printing a plurality of inter-module rails on said substrate wherein each inter-module rail is associated with a respective photovoltaic module; and printing a plurality of junctions associated with said module terminals, said inter-module rails and/or said bus bars, said junctions being adapted to electrically connect said photovoltaic modules in series and/or parallel on demand.

Optionally, the first terminal of each module includes a first junction for electrically connecting said first terminal to said first bus bar at least when the associated module is a leading module at one end of a unit of modules, and wherein said second terminal of each module includes a second junction for electrically connecting said second terminal to said second bus bar at least when the associated module is a trailing module located at another end of said unit of modules.

Optionally, or each inter-module rail includes a third junction for electrically connecting a first or second terminal of an associated module to the second or first terminal respectively of the adjacent module at least when the associated module is to be connected in series to said adjacent module.

Optionally, n modules are electrically connectable in series to form a minor unit of n modules, and wherein n is an integer. The minor unit of n modules may be repeated along said carrier substrate at least once to form m minor units of n modules each, and wherein m is an integer. The m minor units of n modules may be electrically connectable in parallel to form a major unit of n×m modules.

In one embodiment, the carrier substrate may comprises a bendable foil. The method may comprise rolling up the bendable foil to form a roll.

In one embodiment, each module comprises a plurality of photovoltaic cells electrically connected in series between said first and second module terminals. Each inter-module rail may comprise a printed conducting material. Moreover, each said first and second bus bar may comprise a printed conducting material, a laminated metal foil or a combination thereof.

Typically, the first module terminal has a positive electrical potential relative to said second module terminal. Further, the first bus bar may have a positive electrical potential relative to said second bus bar.

The first junction may comprise at least one gap which is electrically linkable between said first module terminal and said first bus bar. The link may be made via a conductive paste, a conductive ink or a conductive paste. The first junction may comprise a severable link between first module terminal and said first bus bar, said link may be maintained at least when the associated module is a leading module at one end of a unit of modules, and said link may be severed when the associated module is not a leading module at one end of a unit of modules.

The second junction may comprise at least one gap which is electrically linkable between said second module terminal and said second bus bar, the link being made at least when the associated module is a trailing module located at another end of said unit of modules. The link may be made via a conductive paste, a conductive ink or a conductive paste. The second junction may comprise a severable link between said second module terminal and said second bus bar, said link being maintained at least when the associated module is a trailing module located at another end of said unit of modules, and said link being severed when the associated module is not a trailing module located at another end of said unit of modules.

The third junction may comprises at least one gap which is electrically linkable between said first or second module terminal and the inter-module rail of the adjacent module, said link being made at least when the associated module is to be connected in series to the adjacent module. The link may be made via a conductive paste, a conductive ink or a conductive paste. The third junction may comprise a severable link between said first or second module terminal and the inter-module rail of the adjacent module, said link being maintained at least when the associated module is to be connected in series to the adjacent module, and said link being severed when the associated module is not to be connected in series with the adjacent module.

BRIEF DESCRIPTION OF THE DRAWINGS

Specific embodiments of the present invention will now be described by way of example and with reference to the accompanying drawings. It is to be understood that the embodiments are given by way of illustration only and the invention is not limited by this illustration. In the drawings.

Figure 1:
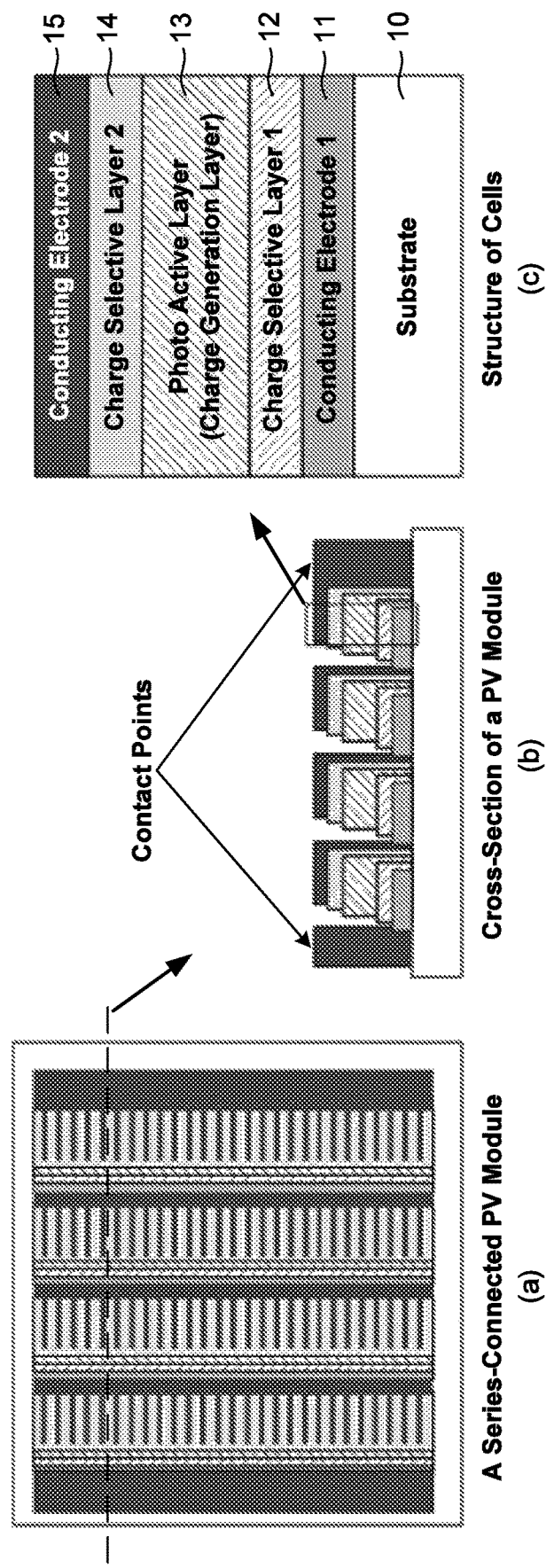
FIG. 1a shows an example of a PV module with four cells connected in series.
FIG. 1b shows a cross-section of a PV module.
FIG. 1c shows details of structure of a PV cell.

While the present invention is susceptible to various modifications and alternative forms, specific embodiments have been shown by way of examples in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF PREFERRED EMBODIMENTS

Definitions

Photovoltaic Cell

In the context of the present invention, the term 'photovoltaic cell' denotes a unit comprising one or more elements that convert light that impinges on its surface and upon being absorbed is converted into electrical energy in the form of a current at a given voltage in an external circuit.

Photovoltaic Module

In the context of the present invention, the term 'photovoltaic module' denotes a module comprising a plurality of photovoltaic cells.

Module Terminal

In the context of the present invention, the term 'module terminal' denotes an output terminal of a photovoltaic module. A photovoltaic module may comprise two module terminals e.g. a positive terminal and a negative terminal. In the photovoltaic module according to the present invention, the photovoltaic module comprises one positive module terminal and one negative module terminal between which the photovoltaic cells are arranged.

Printed

In the context of the present invention, the term 'printed' denotes any kind of transfer process, such as rotary screen printing, flat bed screen printing, gravure printing, flexographic printing, inkjet printing, slot-die coating, knife coating, blade coating, bar coating and coil coating.

Web

In the context of the present invention, the term 'web' denotes a thin sheet of a material such as metal foil or plastics foil. In one embodiment, the web may have a thickness which is below 1 mm, including below 0.9 mm, or below 0.8 mm, or below 0.75 mm, or below 0.7 mm, or below 0.6 mm, or below 0.5 mm, or below 0.4 mm, or below 0.3 mm, or below 0.25 mm, or below 0.2 mm, or below 0.1 mm.

In one embodiment, the web may be made of a bendable material and may have a bend radius below 1000 mm, including below 500 mm, or below 250 mm, or below 125 mm, or below 100 mm, or below 75 mm, or below 50 mm, or below 40 mm, or below 30 mm, or below 25 mm, or below 20 mm, or below 15 mm, or below 10 mm, or below 5 mm.

Bend Radius

In the context to the present invention, the term 'bend radius' denotes a minimum measure, which is measured inside a curvature, by which a material may be bent without breaking, being damaged or have a shortened life. In one embodiment, the material may be bent to this radius without being plastically deformed, in other words the material may be only elastically deformed when bent to this radius. Thus, it may be appreciated that the smaller the bend radius of a material is, the more flexible and bendable the material is. Similarly it may be appreciated that the larger the bend radius is, the stiffer the material is.

One way of testing the bend radius of the web may be to provide a cylinder with a radius corresponding to the bend radius. Subsequently, the web may be bent about the cylinder. As an example a cylinder with a radius of 25 mm may be provided and subsequently, the web may be bent about the cylinder. Finally, the photovoltaic module may be tested so as to determine whether it is still functioning, i.e. capable of generating the same amount of electricity as a web which has not been bent.

Organic

In the context of the present invention, the term 'organic' denotes a material that comprises molecules built through carbon-carbon bonds that may be saturated or unsaturated and that can be connected in a conjugated fashion to convey semiconducting properties. The organic materials may include one or more other elements such as hydrogen, nitrogen, oxygen, sulphur, selenium, phosphorous and metal ions.

The present invention may provide an interconnection method for printed solar films (PSFs) including solution processed solar cells produced by printing on flexible substrates. Solution processed solar cells including organic solar cells, organic-inorganic hybrid perovskite solar cells; inorganic nano particle based solar cells are typically fabricated on transparent conducting electrodes (TCEs).

FIG. 1a shows an example of a TCE based PV module with four cells in a series connection and FIG. 1b shows a cross-section of the PV module. In a research laboratory, devices are typically fabricated as small area single cells. In contrast, series-interconnection of cells is required for a large area device due to limited conductivity of TCEs. Losses originating from high resistivity, so called ohmic losses, of TCEs may become significant when cell width is more than centimetre scale. Therefore, a striped pattern design as shown in FIG. 1a is typically used to fabricate a large area TCE based device.

FIG. 1c shows details of the structure of a PV cell in cross-section. The cross-section includes substrate 10, conducting electrode 11, charge selective layer 12, photoactive layer 13, charge selective layer 14 and conducting electrode 15.

Substrate 10 may comprise a plastic material such as PET, PEN and polyimides metal foils with insulating coating and flexible glasses. Conducting electrode 11 typically comprises Indium doped tin oxide (ITO). Alternatively, other metal oxides, conducting polymers, metal nanowire and composite (metal grid with other conducting materials) may be used. In the case of a top illumination device with a transparent top electrode, conducting electrode 11 may include opaque metals.

Charge selective layer 12 (also called a buffer layer or charge (electron, hole) transport layer) is optional as the device may operate without layer 12. Materials may typically include metal oxides or organic semiconductors. Double or triple layers and/or composite materials may also be used.

Conducting electrode 15 may comprise a similar material as is used for conducting electrode 11. When a TCE is used for conducting electrode 11, conducting electrode 15 may comprise an opaque conductor.

The module design is mainly useful when the application area is small (typically smaller than A3 size) and is typically used in sheet form. For large area applications, solar cells are traditionally produced on long films in roll form via a roll-to-roll process. The module pattern may be repeated and series-connected along a processing direction.

As described above, a practical interconnection method has been developed that uses an infinite interconnection of cells referred as an infinity design to produce a relatively high voltage without suffering ohmic losses due to high current from a large cell area. Although the infinity design is practical and useful, there are limitations in real world applications as discussed above.

To address the limitations of conventional sheet module and infinity designs the present invention proposes a hybrid interconnection design. The proposed hybrid design comprises repeated unit modules, inter-module rails and parallel bus bars as described below with reference to FIGS. 3 to 7.

Figure 2:
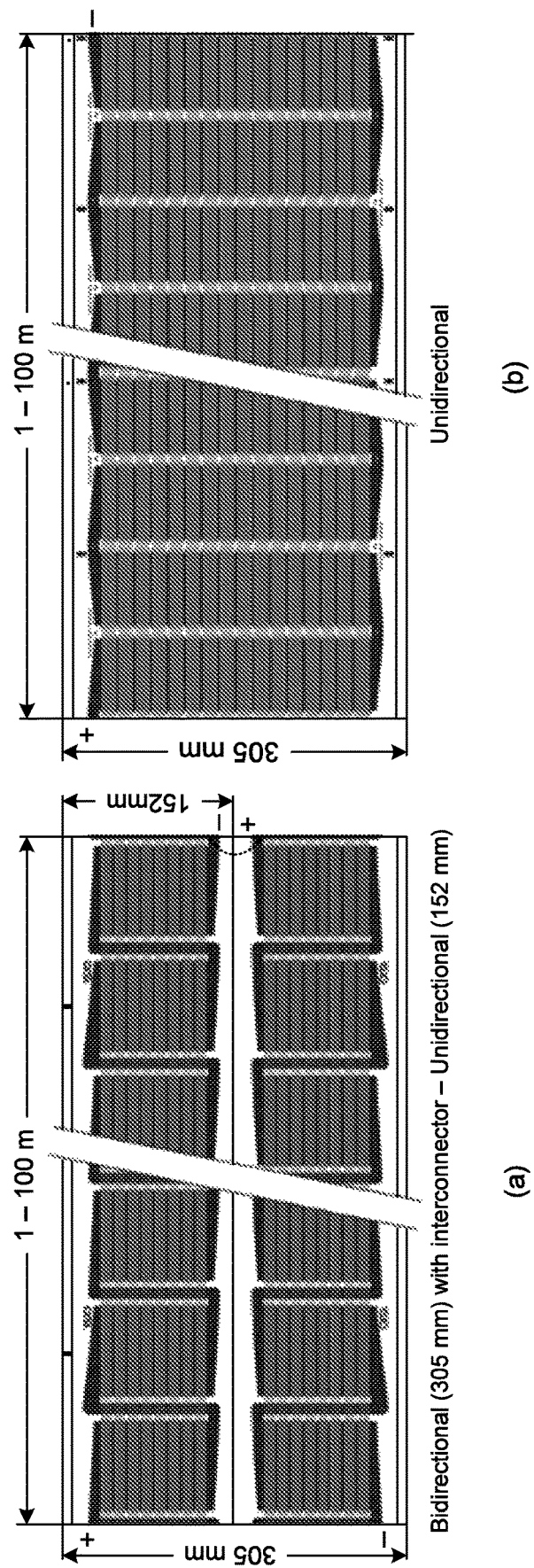
FIG. 2a shows an example of bidirectional infinitely interconnected PV modules.
FIG. 2b show an example of unidirectional infinitely interconnected PV modules.
Figure 3:
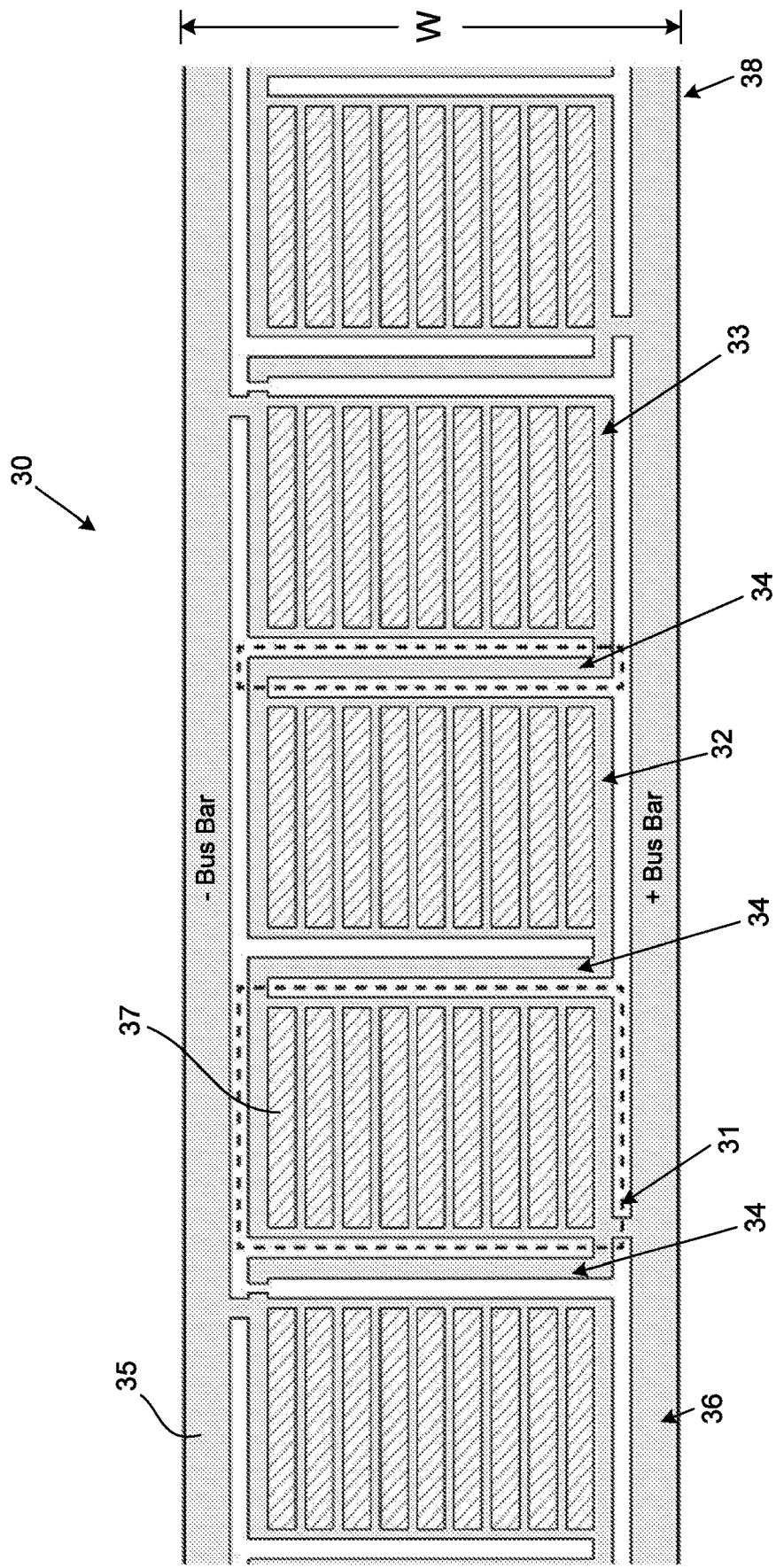
FIG. 3 shows an example of a PSF layout in a hybrid design with three series connected modules.

FIG. 3 shows an example of a PSF layout in a hybrid design 30 with three modules 31-33 connected in series via inter-module rails 34 to form a minor unit wherein minor units are parallel-connected to bus bars 35, 36 to form a major unit. A desired output voltage between bus bars 35, 36 may be determined by selecting the number of series-connected modules in a repeating minor unit. The leading and trailing modules of each minor unit may be connected to bus bars 35, 36 so that power may be collected at any point on bus bars 35, 36. The hybrid-interconnection design may be used with multi-channel designs such as the bidirectional design shown in FIG. 2a.

Each of the three photovoltaic modules 31-33 includes a plurality of photovoltaic cells 37 connected in series. For illustrative purposes, 9 photovoltaic cells are shown in each photovoltaic module. However, in practice, any suitable number of photovoltaic cells can be included in each photovoltaic module. Typically, 5 to 20 photovoltaic cells 37 are included in each module 31-33, for example if the with substrate 38 has width (W) of roughly 30 cm. In one embodiment, 5 photovoltaic cells 37 are included in each module 31-33. In another embodiment, 16 photovoltaic cells 37 are included in each module 31-33. In a further embodiment, 20 photovoltaic cells 37 are included in each module 31-33. In other embodiments, more photovoltaic cells 37 may be included in each module 31-33, particularly if the width (W) of the substrate 38 is increased.

It can be more clearly appreciated from at least FIG. 3 that embodiments of the present invention advantageously allows the connections between the photovoltaic modules to be selectively configured in a flexible manner so as to provide any custom output in order to suit any application. Due to the size, arrangement and configuration of the photovoltaic cells and modules, it has been found that selectively configuring the series/parallel connections between the photovoltaic modules using, for example, the inter-module rails and junctions would be much easier than attempting to achieve a similar outcome by altering connections between individual photovoltaic cells.

Figure 4:
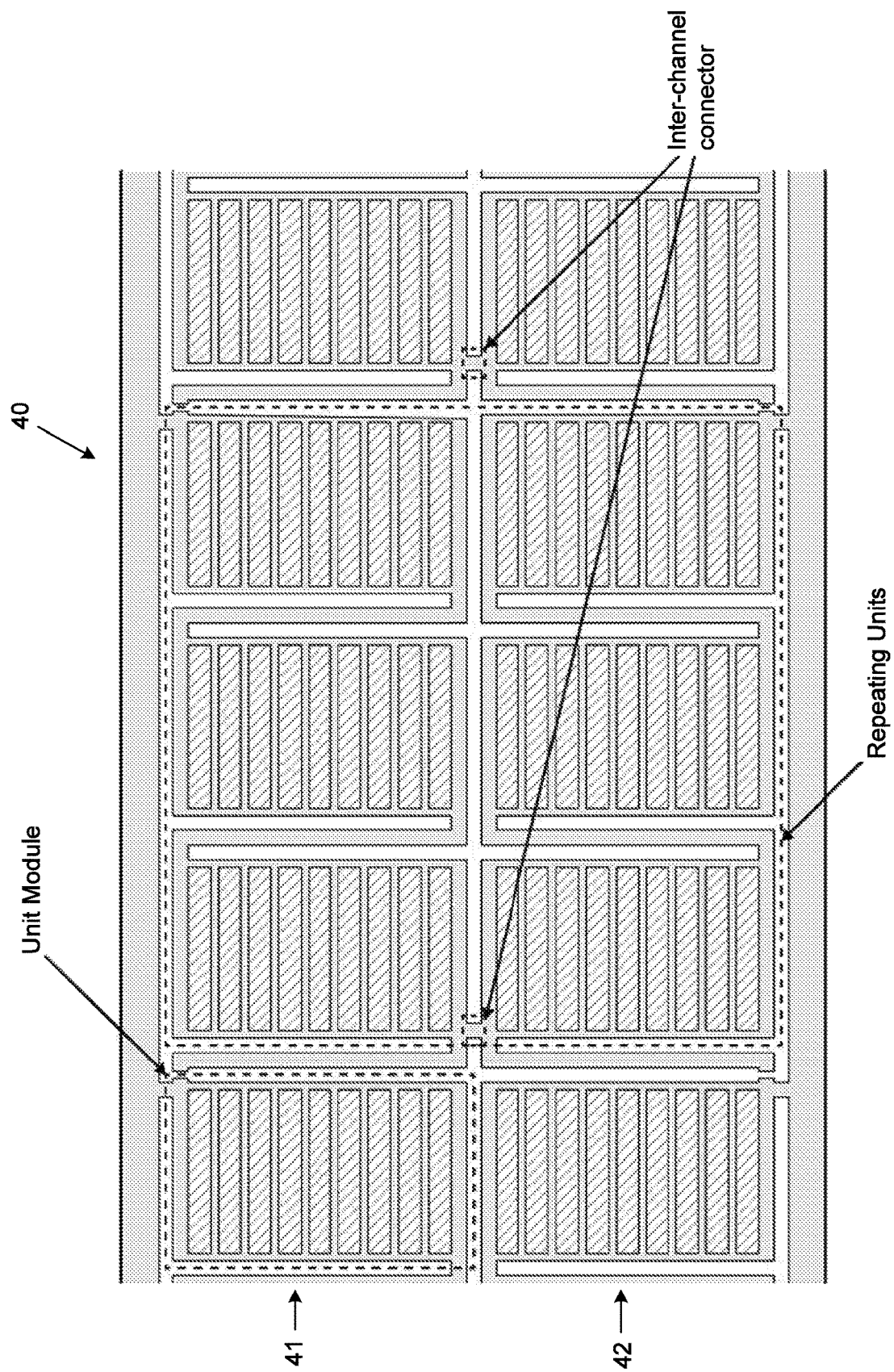
FIG. 4 shows a PSF layout in a hybrid design configured with two channels.
Figure 5:
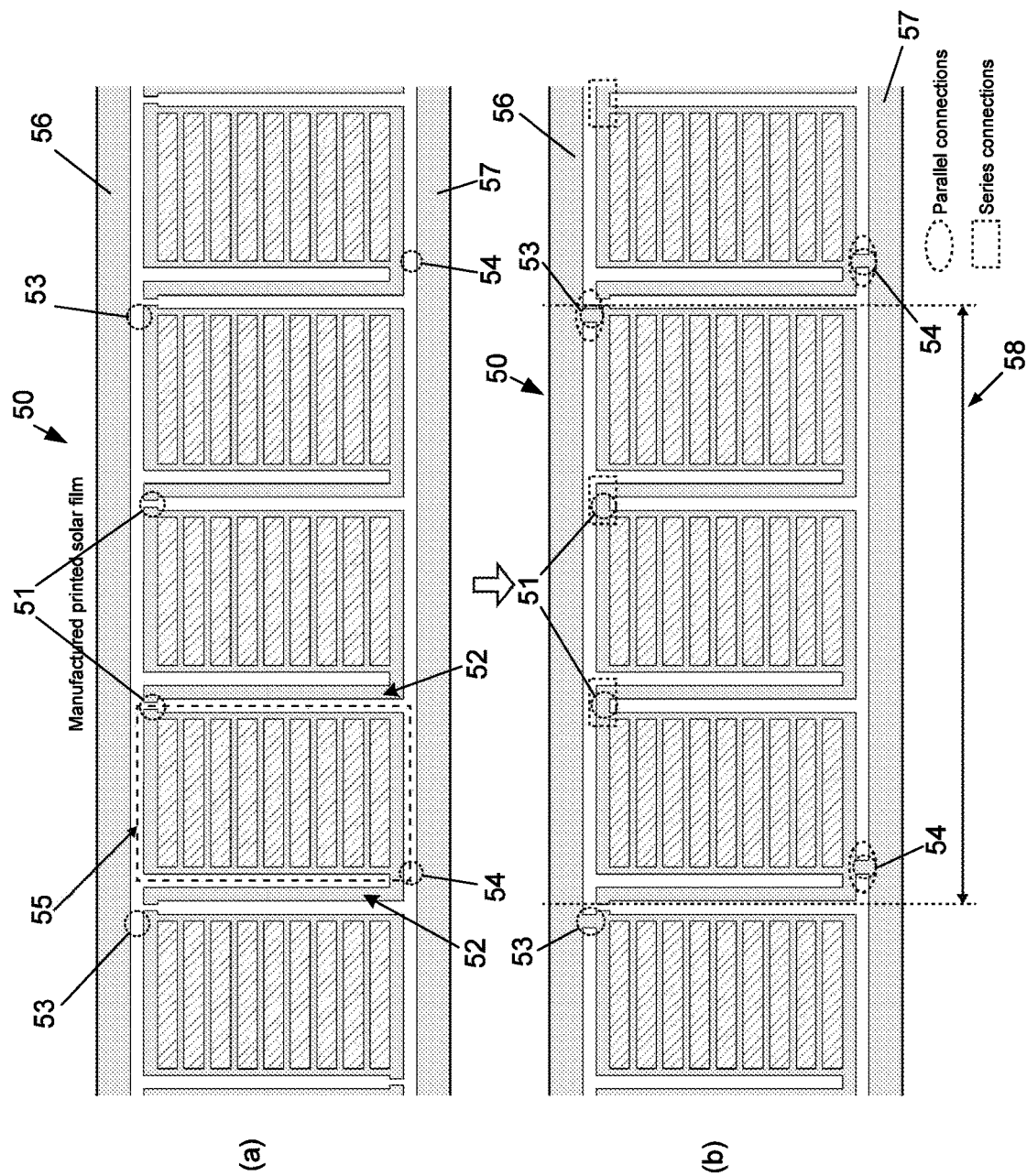
FIG. 5a shows a PSF layout with linkable gaps for inter-module rails and between modules and bus bars.
FIG. 5b shows the layout of FIG. 5a after the gaps have been bridged.

FIG. 4 shows a PSF layout in a hybrid design 40 configured with two channels 41, 42. The hybrid design may be achieved by printing rails and/or bus bars and connections and/or junctions by any known industrial or mass manufacturing method such as screen printing and modifying the mass-produced connections or junctions using various methods as described below.

In some embodiments small gaps may be provided in inter-module connections and between unit modules and bus bars, which may be easy to bridge, link or fill. The gaps may be bridged, linked or filled with conductive ink using various tools such as solution dispenser, stamp, slot die, spray, brush and ink jet printing. The gaps may also be bridged or linked via conductive tapes and/or stickers.

FIG. 5a shows a PSF layout 50 with linkable gaps 51 associated with inter-module rails 52 and linkable gaps 53, 54 between modules 55 and bus bars 56, 57.

Gaps 51 are electrically linkable to the associated module terminal when the associated module is to be connected in series to the adjacent module.

Gaps 53 are electrically linkable to bus bar 56 when the associated module is to be connected in parallel to an adjacent module.

Gaps 54 are electrically linkable to bus bar 57 when the associated module is to be connected in parallel to the adjacent module. In each case the link may be made via a conductive paste or the like.

FIG. 5b shows the same layout 50 after gaps 51, 53, 54 have been bridged or connected via a conductive paste. After gaps 51, 53, 54 are bridged; layout 50 forms a minor unit 58 comprising 3 modules connected in series as shown in the example of FIG. 5a. Minor units 58 may be repeated along the carrier substrate at least once to form m minor units of 3 modules each wherein m is an integer. The m minor units of n modules may be electrically connected in parallel to form a major unit of 3×m modules.

Figure 6:
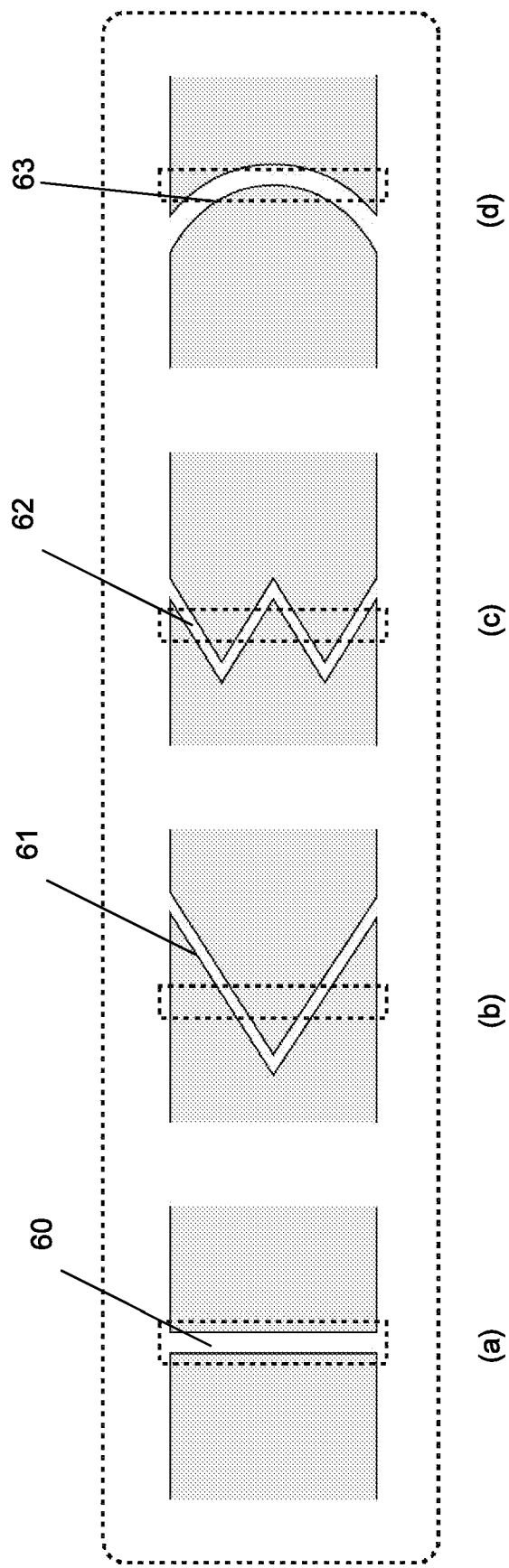
FIG. 6 shows examples of linkable gaps that include a simple line or complex shapes.
Figure 7:
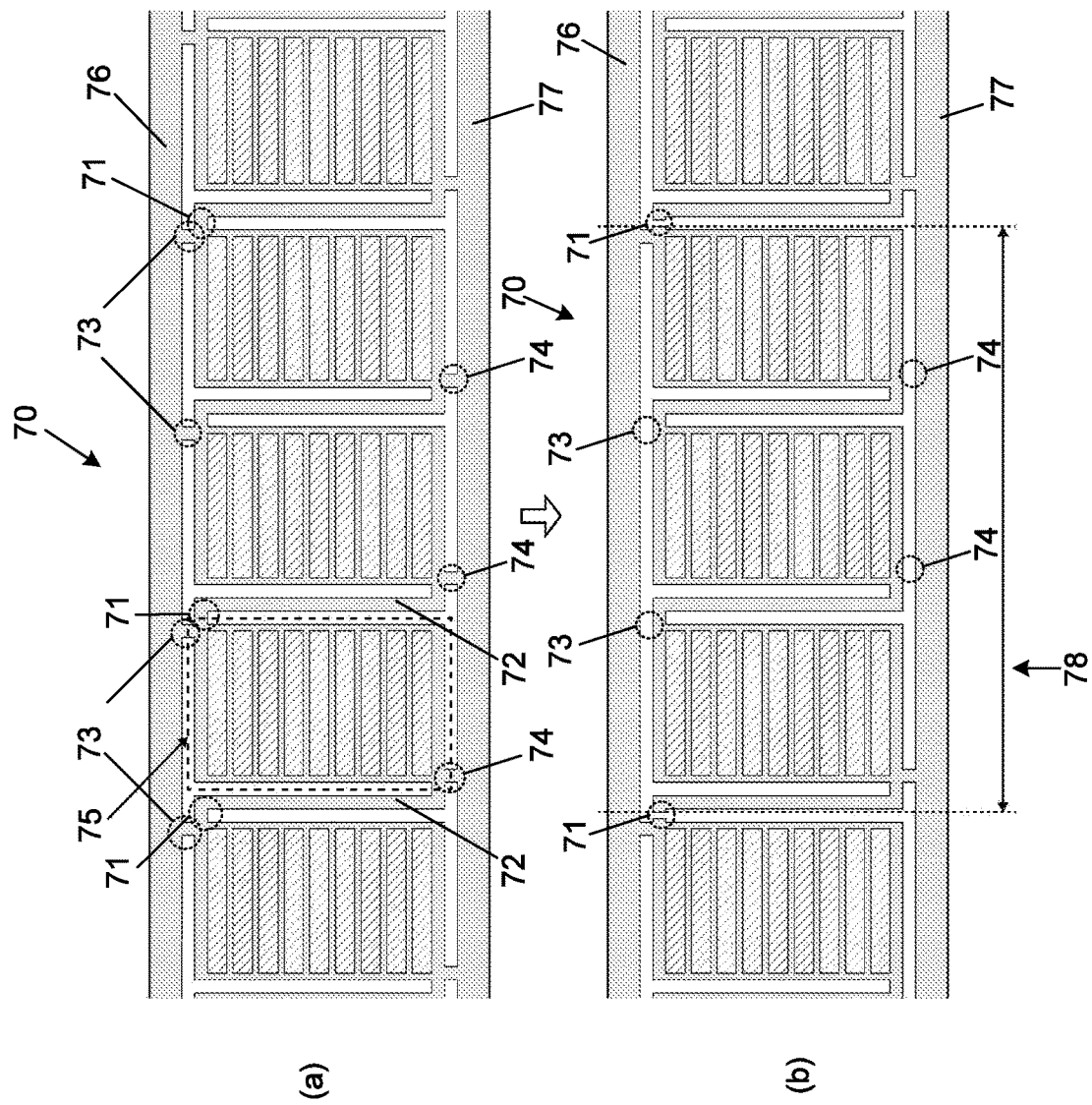
FIG. 7a shows a PSF layout with severable links for inter-module rails and between modules and bus bars.
FIG. 7b shows the layout of FIG. 7a after the links have been severed.

As shown in FIG. 6 each gap 51, 53, 54 may include a simple straight line 60 (FIG. 6a) or it may include more complex shapes 61-63 (FIGS. 6b to 6d) to better accommodate error tolerance in connecting or bridging the gaps. Each gap may be bridged or connected via a conductive paste or the like.

In other embodiments all photovoltaic modules may initially be connected via severable links and also parallel connected to bus bars. Connections between inter-module rails and bus bars may be subsequently disconnected or severed in any number of ways to determine the number of series-connected unit modules in a repeating unit. The connections may be severed via laser scribing, mechanical scribing and/or chemical etching.

FIG. 7a shows a PSF layout 70 with severable links 71 associated with inter-module rails 72 and severable links 73, 74 between modules 75 and bus bars 76, 77.

Links 71 are maintained when the associated module is to be connected in series to the adjacent module. Links 71 are severed when the associated module is to be connected in parallel with the adjacent module.

Links 73, 74 are maintained when the associated module is to be connected in parallel to an adjacent module. Links 73, 74 are severed when the associated module is to be connected in series to the adjacent module.

FIG. 7b shows the same PSF layout 70 after links 71, 73, 74 have been severed. After links 71, 73, 74 have been severed; layout 70 forms a minor unit 78 comprising three modules connected in series as shown in the example of FIG. 7b. Minor units 78 may be repeated along the carrier substrate at least once to form m minor units of 3 modules each wherein m is an integer. The m minor units of n modules may be electrically connected in parallel to form a major unit of 3×m modules.

Figure 8:
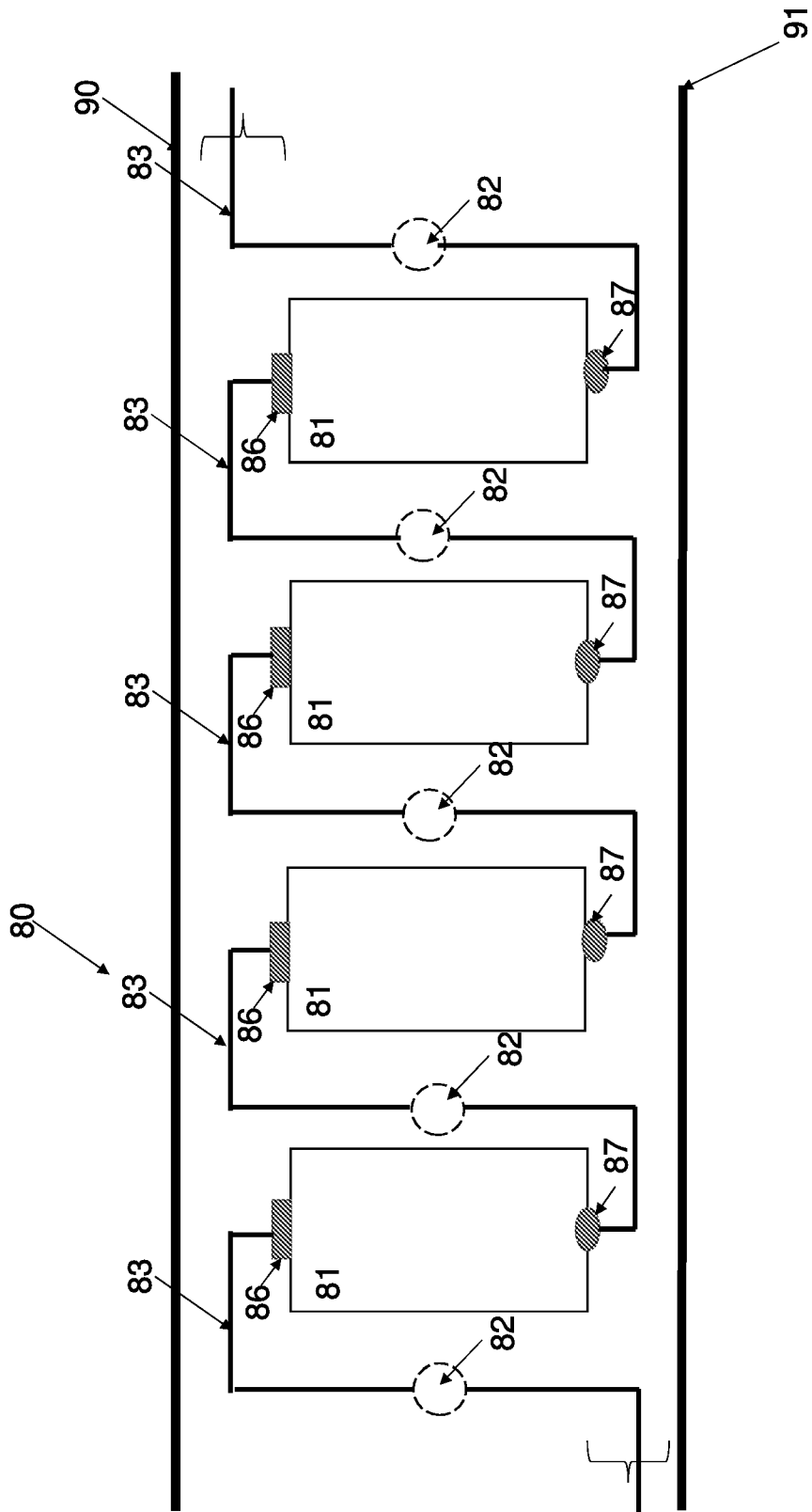
FIG. 8a shows a PSF layout with linkable gaps for inter-module rails.
FIG. 8b shows an alternative PSF layout with linkable gaps between modules, inter-module rails and bus bars.
FIG. 8c shows the layout of FIG. 8b after the gaps have been bridged or connected.
Figure 8:
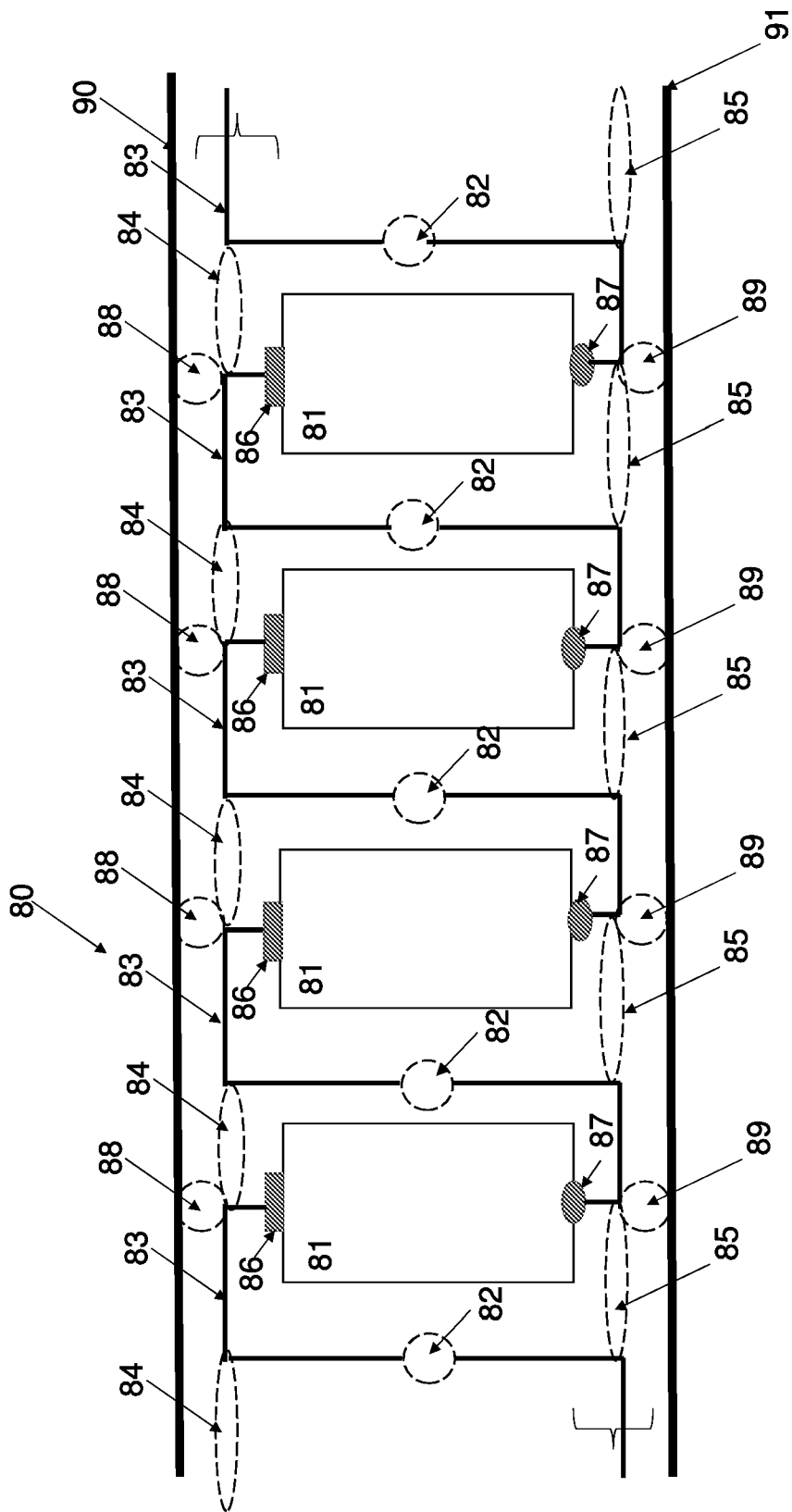
Figure 8:
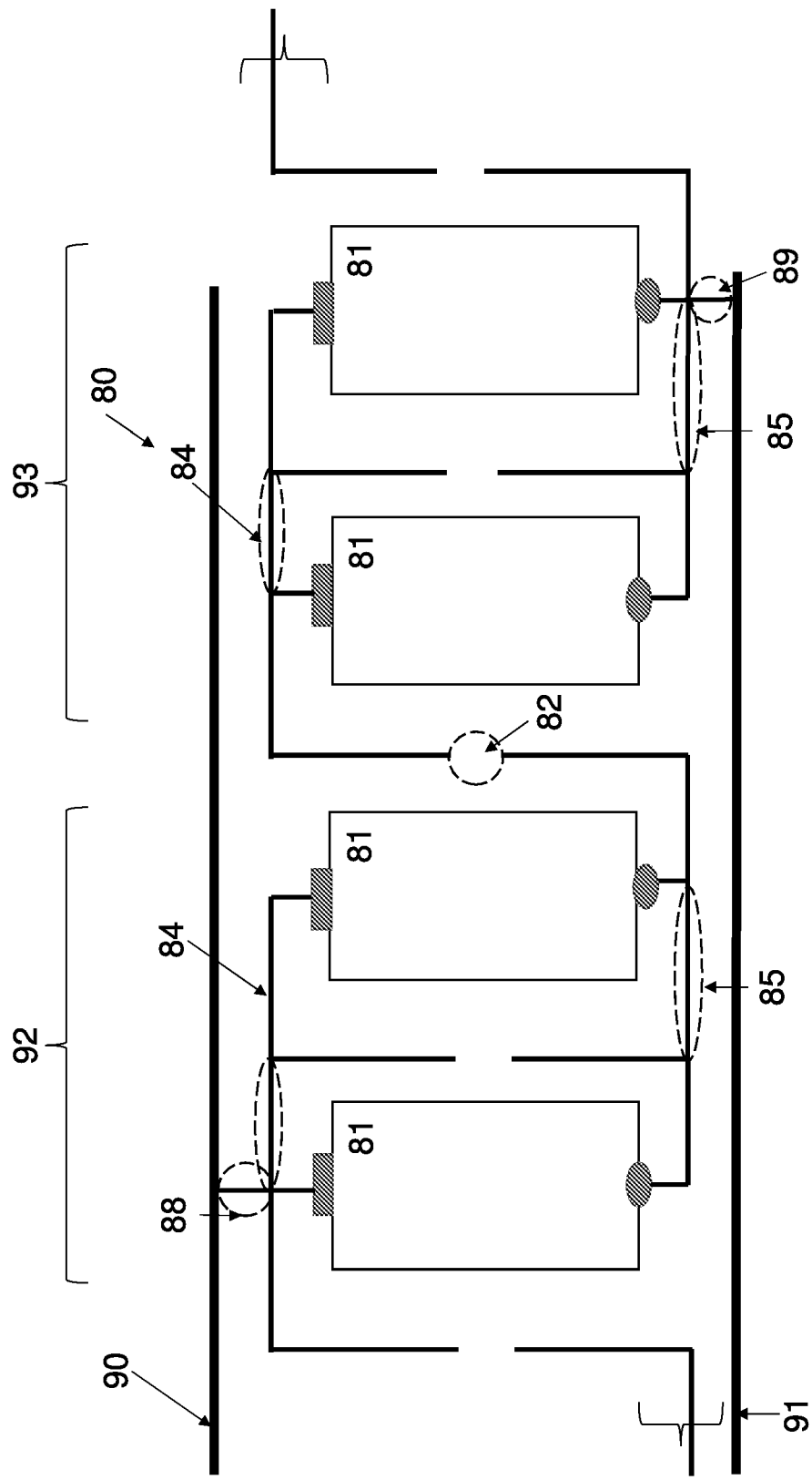

FIG. 8a shows a PSF layout 80 comprising a plurality of modules 81 with linkable gaps 82 associated with inter-module rails 83. Gaps 82 are electrically linkable at least when the associated module/unit of modules is to be connected in series to the adjacent module/unit of modules.

FIG. 8b shows an alternative PSF layout 80 comprising a plurality of modules with linkable gaps 82 associated with inter-module rails 83, linkable gaps 84, 85 associated with module terminals 86, 87 and linkable gaps 88, 89 between module terminals 86, 87 and bus bars 90, 91. Gaps 82 are electrically linkable at least when the associated module/unit of modules is to be connected in series to the adjacent module/unit of modules. Gaps 84, 85 associated with module terminals 86, 87 are electrically linkable at least when the associated module is to be connected in parallel to an adjacent module.

Gaps 88 are electrically linkable to bus bar 90 at least when an associated leading module or unit of modules is to be connected in parallel to the adjacent module/unit of modules. Similarly Gaps 89 are electrically linkable to bus bar 91 at least when the associated trailing module/unit of modules is to be connected in parallel to the adjacent module/unit of modules. In each case the link may be made via a conductive paste, a conductive ink or a conductive tape or the like.

FIG. 8c shows the same layout 80 after gaps 82, 84, 85, 88 and 89 have been bridged or connected on demand via a conductive paste (or left disconnected as the case may be). After the gaps are bridged (or left disconnected); layout 80 forms minor units 92, 93 each comprising two modules connected in series. Minor units 92, 93 may be repeated along the carrier substrate to form m minor units of two modules each wherein m is an integer. The m minor units of n modules may be electrically connected in parallel to form a major unit of two×m modules.

Figure 9:
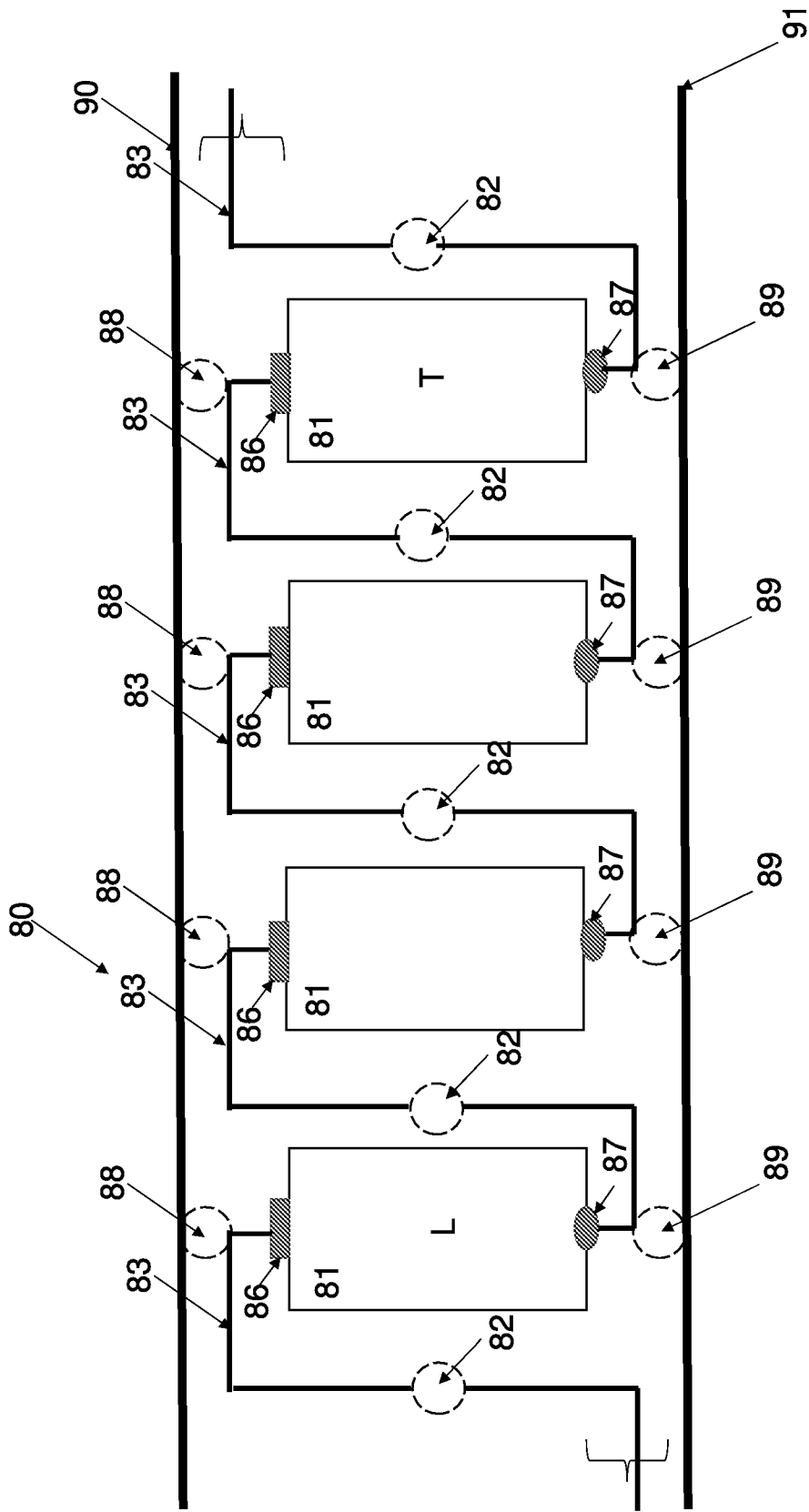
FIG. 9a shows a PSF layout with linkable gaps for series connections between leading module L and trailing module T.
FIG. 9b shows an alternative PSF layout to FIG. 9a, also having linkable gaps for series connections between leading module L and trailing module T.
Figure 9:
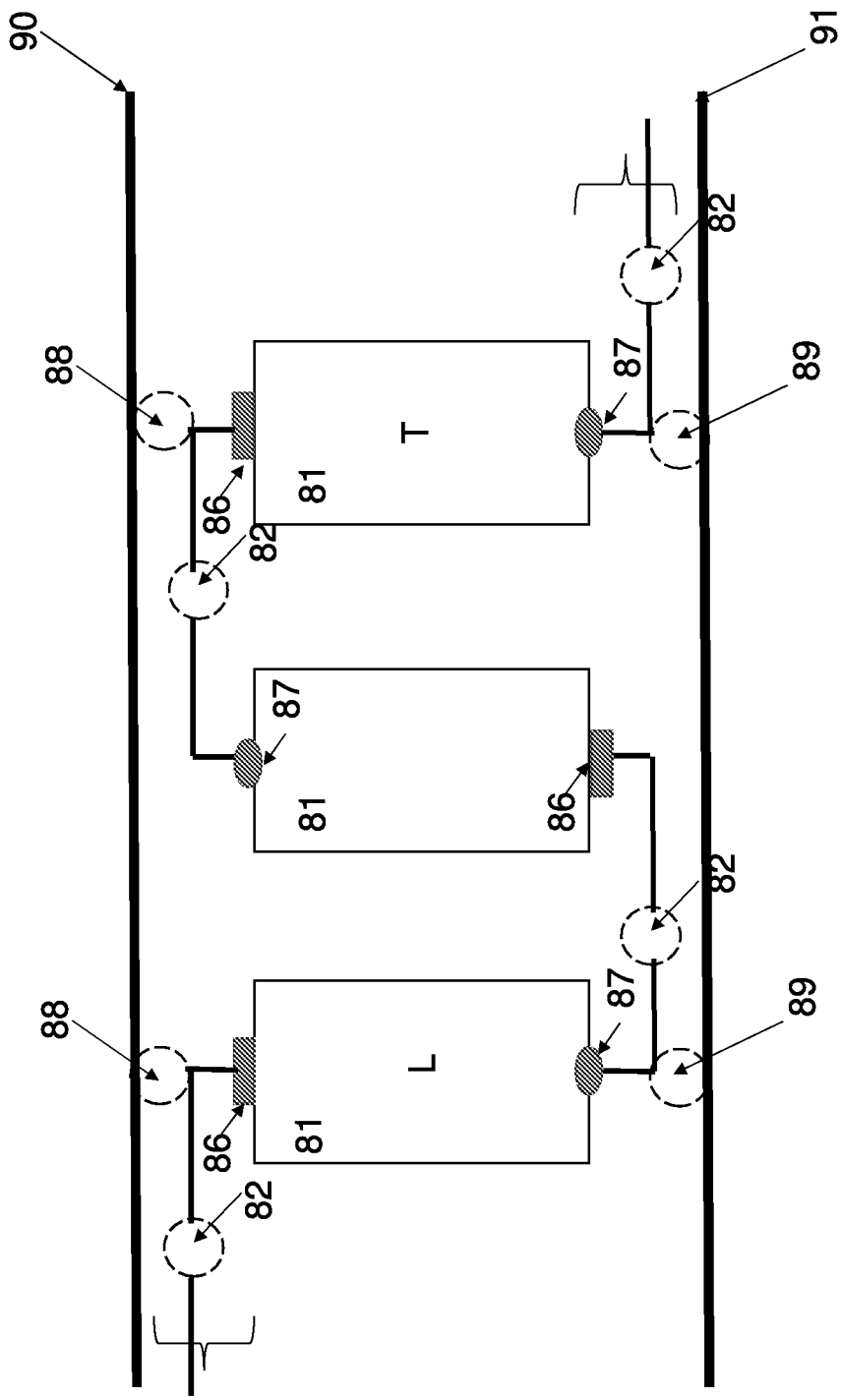

FIG. 9a shows a PSF layout 80 comprising a plurality of modules 81 with linkable gaps 82 associated with inter-module rails 83, and linkable gaps 88, 89 between module terminals 86, 87 and bus bars 90, 91, for series connections between leading module L and trailing module T.

FIG. 9b shows an alternative PSF layout 80 comprising a plurality of modules 81 with linkable gaps 82 between module terminals 86, 87, and linkable gaps 88, 89 between module terminals 86, 87 and bus bars 90, 91 for series connections between leading module L and trailing module T.

Figure 10:
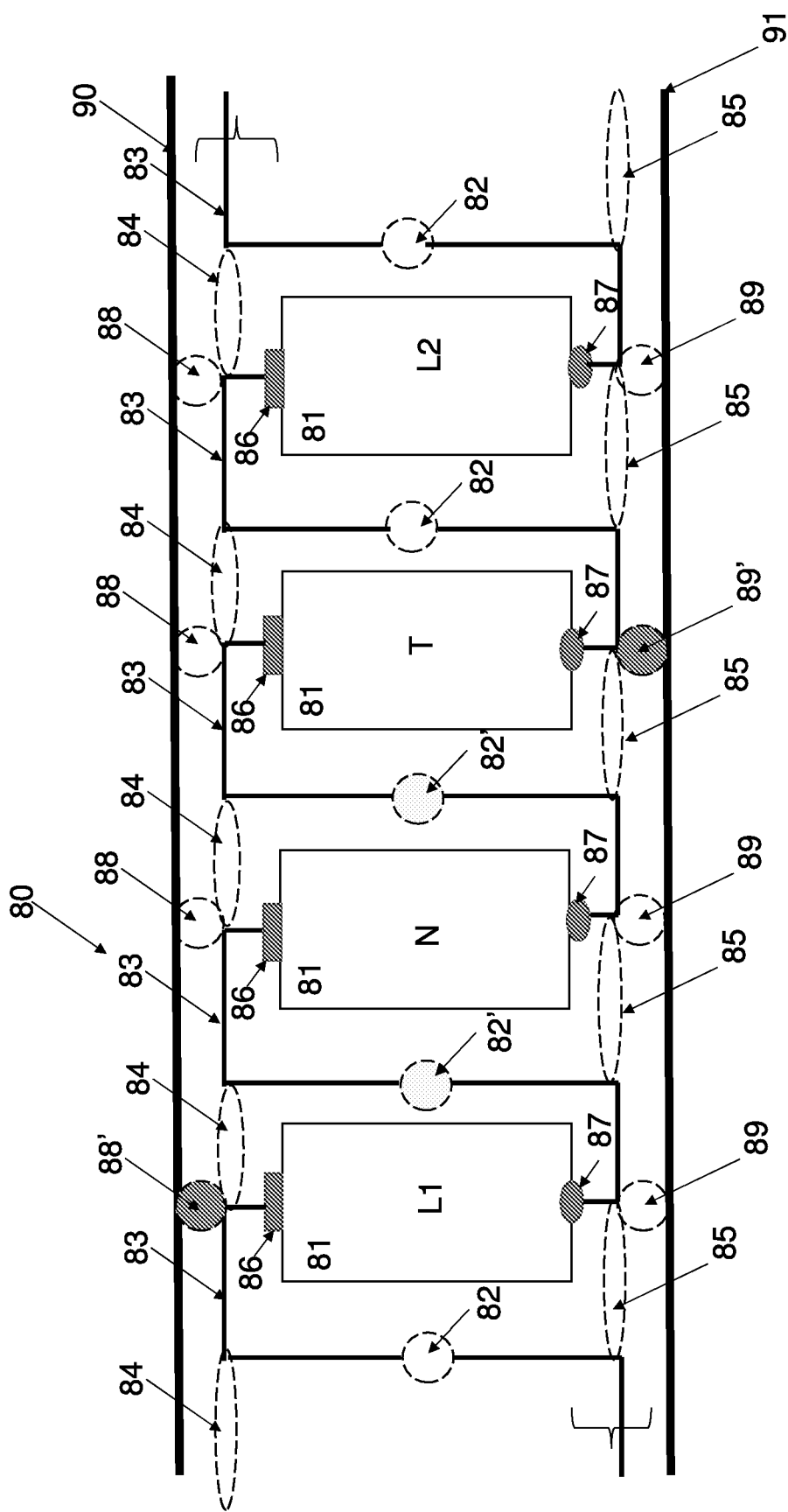
FIG. 10a shows an example of a photovoltaic module or unit comprising three electrically connected modules according to one embodiment.
FIG. 10b shows an example of a photovoltaic module or unit comprising four electrically connected modules according to another embodiment.
Figure 10:
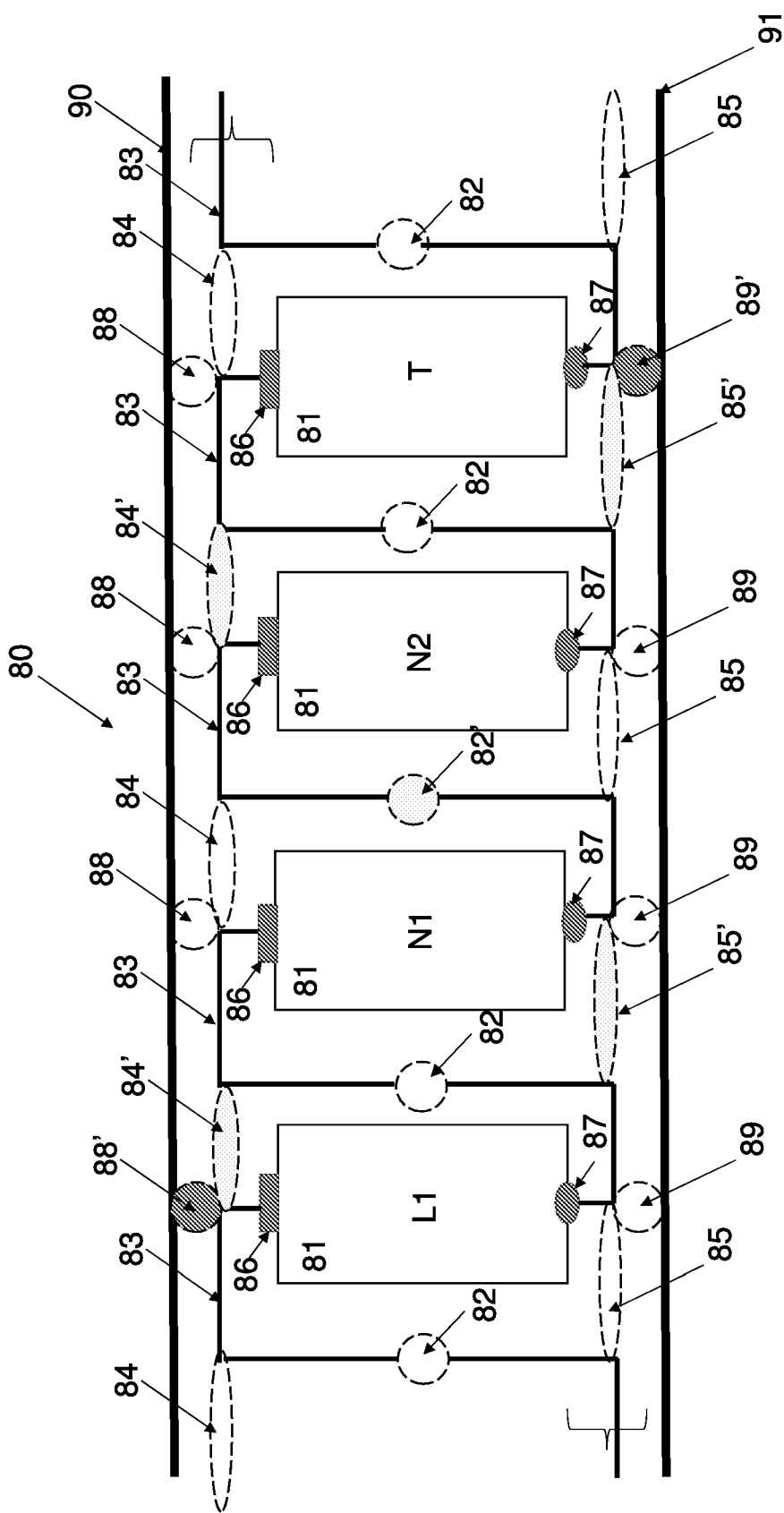

FIG. 10*a* shows an example PSF layout 80 of a photovoltaic module or unit of three electrically interconnected photovoltaic modules. A unit of three modules 81 is shown with a leading unit L1 connected to bus bar 90 via junction 88' and a trailing unit T connected to bus bar 91 via junction 89', with modules L1, N and T connected in series to one another via junctions 82'. Other junctions 84, 85, 88 and 89 between L1 and T remain disconnected. L2 will form part of a separate unit.

FIG. 10*b* shows an example PSF layout 80 of a photovoltaic module or unit comprising four electrically connected modules. A unit of four modules 81 is shown with a leading unit L1 connected to bus bar 90 via junction 88' and a trailing unit T connected to bus bar 91 via junction 89'. Modules L1 and N1, and N2 and T are connected to each other in parallel via junctions 84' and 85'. Modules N1 and N2 are connected to each other in series via junction 82'. Other junctions 82, 84, 85, 88 and 89 between L1 and T remain disconnected.

In further embodiments the photovoltaic modules may be connected via a combination of methods including linkable gaps and severable links as described above with reference to FIGS. 5-10.

Compared to a conventional module sheet, the present invention may allow relatively large area devices to be produced. Output voltage of large area solar cells may be set on-demand after or during a manufacturing process.

In a large area installation, output voltage may be set to a safe level and/or may be compatible with any inverter system. In a large area installation, printed solar films may be cut to a desired length (with limited freedom or anywhere with some area wastage when the middle of a repeating unit is cut) regardless of required output voltage.

Energy may be collected from anywhere on the bus bars. Interconnections between PSFs may be made at any point for a wide area application such as a multiple PSFs installation in a parallel direction.

The photovoltaic apparatus and method of the present invention may be particularly suitable for use with solution processed solar cells on flexible substrates.

A method 110 of manufacturing a printed solar film (PSF) according to an embodiment of the invention will now be described with reference to FIG. 11. The method 110 can be used to form each of the appropriate layers 11 to 15 formulating the photovoltaic cells as more clearly shown in FIG. 1(*c*) which collectively make up the photovoltaic modules and photovoltaic apparatus as previously described with reference to FIGS. 3 to 10(*b*).

During a first step 112, a carrier substrate 10 (such as a flexible ITO substrate) is provided. For illustrative purposes, the substrate 126 in FIG. 11 moves from in a 'web direction' as illustrated by arrow 128 in FIG. 11 during manufacture. The first conducting electrode layer 11 is applied via a coating process to the substrate 10. A dispenser 126 is used to apply the first conducting electrode layer 11 via the coating process. Preferably, an indium-tin-oxide (ITO) based conductors is used for the first conducting electrode layer. Moreover, the first conducting electrode layer 11 is formed with a thickness range of roughly 100-300 nm.

Unlike some printing processes, this coating process advantageously allows accurate control of the thickness of the applied layers. In particular, the coating process allows uniform layers to be applied at the desired thickness. In addition, the coating process allows each layer to be created continuously as the substrate moves relative to a dispenser, which allows for greater efficiency (e.g. when compared to various printing processes).

Typically, in printing processes, droplets of 'printing ink' are dispensed on a substrate. Such printing processes can create uneven thicknesses, and occasionally gaps (also known as pinholes) in the printed layer. In addition, the thickness of the printed layer is difficult to accurately control, particularly when a high level of accuracy and uniformity is required in the thickness of the printed layer.

During a second step 114, the first charge selective layer 12 is applied via the same coating process over the substrate 10 and partially covering the first conducting electrode layer 11. Preferably, first charge selective layer 12 is formed with a thickness range of roughly 10-100 nm.

During a third step 116, the photoactive layer 13 is also applied via the same coating process over the substrate 10 and partially covering first change selective layer 12. Preferably, photoactive layer 13 is formed with a thickness range of roughly 100-500 nm.

Figure 11:
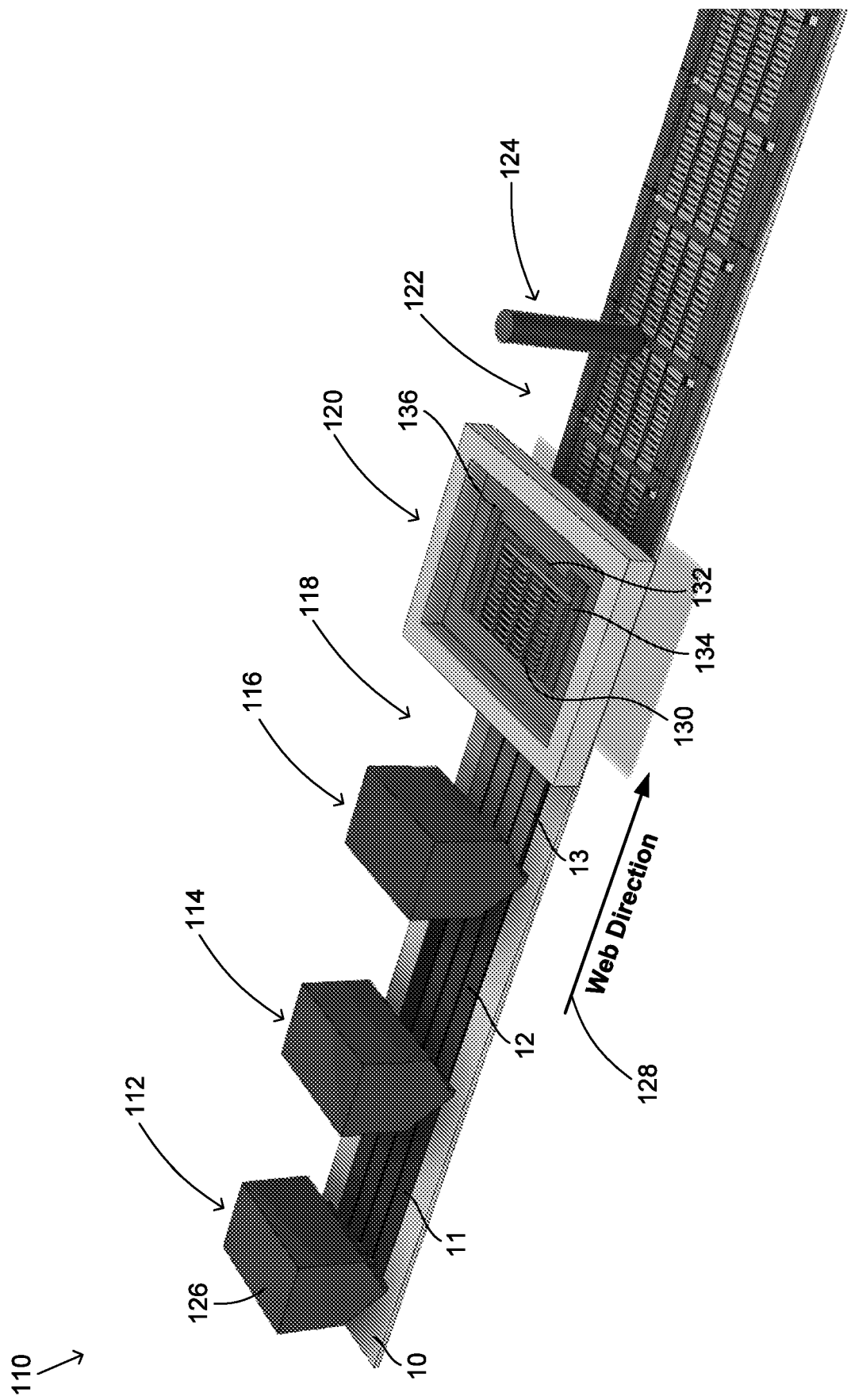
FIG. 11 shows a schematic diagram illustrating steps in a manufacturing process for a Printed Solar Film according to one embodiment of the present invention.

Whilst not shown in FIG. 11, the second charge selective layer 14 can also be applied via the same coating process over substrate 10 and partially covering the photoactive layer 13. Preferably, second charge selective layer 14 is formed with a thickness range of roughly 10-500 nm.

Whilst it is preferably to use a coating process to apply each of the layers 11 to 14 for each of thickness and quality control, a sufficient level of quality may be achieved using certain printing processes. For example, the charge selective layer has reasonable conductivity and it is more thickness tolerant. Accordingly, methods such as rotary screen printing may be used to form the charge selective layer.

Figure 12A:
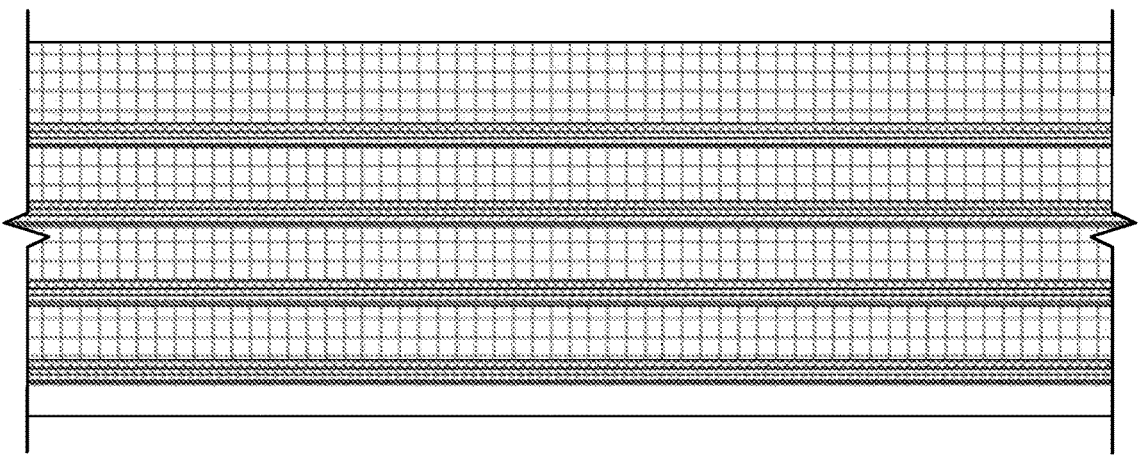
FIG. 12a illustrates a plan view of a section of a substrate of a photovoltaic apparatus carrying each of the first conducting electrode layer 11, first charge selective layer 12, the photoactive layer 13 and the second charge selective layer 14 after a coating process.
Figure 12B:
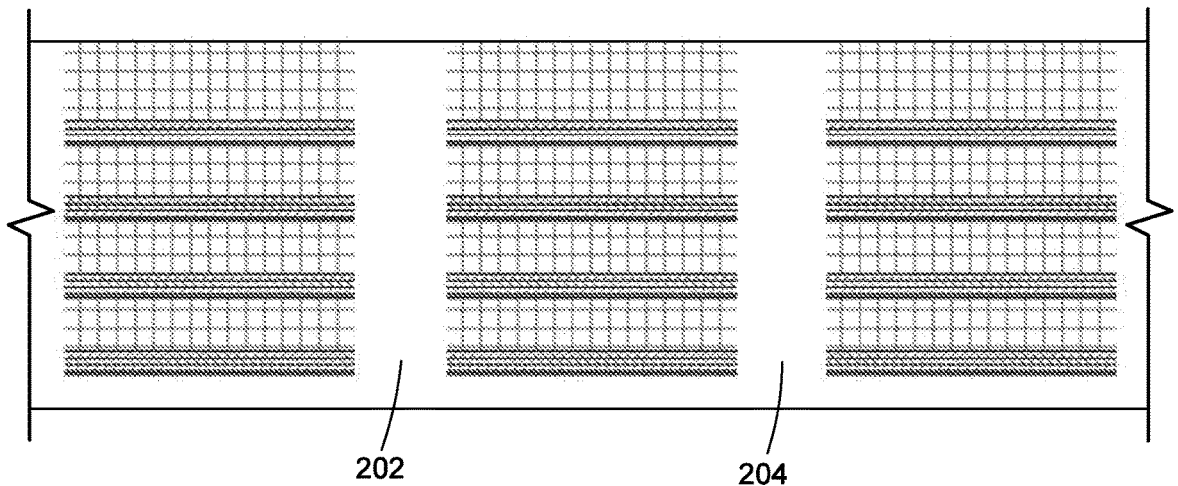
FIG. 12(b) illustrates the substrate shown in FIG. 12a after the relevant portions of each layer 11 to 14 are removed via an etching process so as to form the basis for individual photovoltaic modules.

During an forth step 118 (also not shown in FIG. 11) as more clearly shown in FIGS. 12(*a*) and 12(*b*), portions of one or more of the layers 11 to 14 applied via the coating steps 112 to 116 may be removed to form the basis of individual photovoltaic modules. The number of layer 11 to 14 removed may depend on the conductivity of the layers 11 to 14. Typically, portions of the second charge selective layer 14 in areas denoted by 202, 204 in FIG. 12(*b*) are removed. In some instances, if the conductivity of the charge transport layer (also known as the photo active layer 13) is too high, portions of layers 11 to 14 are removed as more clearly illustrated in FIGS. 12(*a*) and 12(*b*). FIG. 12(*a*) illustrates a plan view of the substrate 10 carrying each of the layers 11 to 14 after the coating steps 112 to 116 are complete. FIG. 12(*b*) illustrates the substrate 10 after the relevant portions of each layer 11 to 14 are removed via any suitable method including delamination and/or scratching so as to create spaces 202, 204 between individual photovoltaic modules.

During a fifth step 120, the second conducting electrode layer 15 is applied via a screen printing process, in which a layer of conductive material is applied to a mesh in a screen, a stencil is created by blocking off parts of the screen in the negative image of the photovoltaic module design to be printed. In one embodiment, the photovoltaic modules are printed with linkable gaps in the inter-module rails and between the modules and bus bars. Thickness of screen printed layer can be controlled by a few parameters including mesh size, thickness of the screen, solid contents in the printed paste, squeeze angle and squeeze pressure. The first two parameters are major control parameters. Typically, the thickness of the second conducting electrode layer 15 may be around 1 um to 10 um. The second conductive electrode layer 15 completes the formation of each photovoltaic module 130, the associated inter-module rails 132 and bus bars 134, 136.

During a sixth step 122 (also not shown in FIG. 11), the substrate 10 is cut to the desired length. Whilst this cutting step 122 can be also carried out after some interconnections are made.

During the final seventh step 124, desirable interconnections on the inter-module rails to connect adjacent photovoltaic modules, and interconnections between the photovoltaic modules and the bus bars are carried out using a distally controlled dispenser. In some embodiments, the interconnections may be formed via conductive tape. In alternative embodiments, existing electric connections may be broken by any suitable process, for example, via etching and/or perforation process. Once the interconnections/disconnections are complete, the printed solar film is encapsulated via a lamination process to protect the substrate 10 and formed layers 11 to 15. The method 110 advantageously allows the design of each photovoltaic apparatus to be customised during step 124 as part of the manufacturing process, and prior to final encapsulation of the solar film.

By providing the selectively configurable junctions which are incorporated into the photovoltaic apparatus design, one or more template or generic photovoltaic apparatus designs can be utilised during production (e.g. via steps 112 to 122 above). The customised interconnections for each photovoltaic apparatus can be then carried out in step 124 before laminating the printed solar film for protection. For example, the dispenser at step 124 can be programmed to create the desired interconnections at the selected junctions. Accordingly, embodiments of the present invention advantageously allow rapid production of high volume custom designed photovoltaic apparatus to suit different application requirements, without the need for further re-configuration after lamination. That is, embodiments of the invention allow different custom designed photovoltaic apparatus to be mass produced on demand in a flexible manner at relatively low costs.

Where the terms "comprise", "comprises", "comprised" or "comprising" are used in this specification (including the claims) they are to be interpreted as specifying the presence of the stated features, integers, steps or components, but not precluding the presence of one or more other features, integers, steps or components, or group thereof.

While the invention has been described in conjunction with a limited number of embodiments, it will be appreciated by those skilled in the art that many alternatives, modifications and variations in light of the foregoing description are possible. Accordingly, the present invention is intended to embrace all such alternatives, modifications and variations as may fall within the spirit and scope of the invention as disclosed.

The present application may be used as a basis or priority in respect of one or more future applications and the claims of any such future application may be directed to any one feature or combination of features that are described in the present application. Any such future application may include one or more of the following claims, which are given by way of example and are non-limiting in regard to what may be claimed in any future application.

The invention claimed is:
1. A printed solar film comprising:
a carrier substrate;
a plurality of printed photovoltaic modules produced on the carrier substrate via a roll-to-roll process, each module having a predetermined layout, each module including:
first and second module terminals, and
a predetermined number of printed photovoltaic cells between the first and second module terminals such that each photovoltaic cell is electrically connected in series with an adjacent photovoltaic cell;
a first printed bus bar extending along one side of the photovoltaic modules;
a second printed bus bar extending along an opposite side of the photovoltaic modules, each of the photovoltaic cells being positioned such that a longitudinal direction of each photovoltaic cell is parallel to the first and second bus bars; and
a plurality of inter-module rails, each inter-module rail is:
produced on the carrier substrate via the roll-to-roll process,
connected to at least one of the first and second module terminals of one or more of the -plurality of printed photovoltaic modules, and
printed with a linkable gap such that the photovoltaic modules are initially disconnected from one another;
a conductive paste, a conductive ink or a conductive tape dispensed over at least the respective linkable gap of one or more of the inter-module rails after the one or more of the inter-module rails are produced via the roll-to-roll process;
wherein the plurality of inter-module rails are at least partly located between adjacent photovoltaic modules in the longitudinal direction; and
wherein the plurality of inter-module rails and gaps or connections between the first and second module terminals and the first and second printed bus bars define a plurality of selectively configurable junctions at predetermined locations on the carrier substrate external to the plurality of photovoltaic modules.

2. The printed solar film A photovoltaic apparatus of claim 1, wherein the plurality of selectively configurable junctions further includes one or more severable links.

3. The printed solar film of claim 1, wherein one or more inter-module rails are configured to enable selective series connection between adjacent photovoltaic modules; and
wherein one or more of the junctions are configured to enable selective parallel connection between adjacent photovoltaic modules.

4. The printed solar film of claim 1, wherein the photovoltaic modules include a first conducting electrode layer, a charge selective layer, and a photoactive layer, wherein each of the layers are formed on the substrate via a coating process.

5. The printed solar film of claim 1, comprising one or more units of modules, each unit including two or more adjacent modules connected in series such that a leading module is disposed at one end of the series connection and a trailing module is disposed at an opposite end of the series connection within each unit,
wherein the first terminal of the leading module includes a first junction for selectively connecting said first terminal to said first bus bar, and
wherein the second terminal of the trailing module includes a second junction for selectively connecting said second terminal to said second bus bar.

6. The printed solar film of claim 1, wherein n modules are electrically connectable in series to form a minor unit of n modules, and wherein n is an integer.

7. The printed solar film according to claim 6, wherein said minor unit of n modules is repeated at least once to form m minor units of n modules each, and wherein m is an integer >2.

8. The printed solar film according to claim 7, wherein said m minor units of n modules are electrically connectable in parallel to form a major unit of n X m modules.

9. The printed solar film claim 1, wherein each inter-module rail comprises a printed conducting material.

10. The printed solar film claim 1, wherein each of the first and second bus bars comprises a printed conducting material, a laminated metal foil or a combination thereof.

11. The printed solar film claim 1, wherein said first module terminal has a positive electrical potential relative to said second module terminal.

12. The printed solar film claim 1, wherein said first bus bar has a positive electrical potential relative to said second bus bar.

13. A printed solar film comprising:
a carrier substrate,
a plurality of units, each unit comprising a plurality of printed photovoltaic modules produced on the carrier substrate via a roll-to-roll process, each module having a predetermined layout, wherein each module comprises
first and second module terminals, and
a predetermined number of printed photovoltaic cells between the first and second module terminals of a photovoltaic module such that each photovoltaic cell is electrically connected in series with an adjacent photovoltaic cell;
a first printed bus bar extending along one side of the plurality of units, wherein the first bus bar is adapted to electrically connect to the first terminal of a leading photovoltaic module in a unit;
a second printed bus bar extending along an other side of the plurality of units, wherein the second bus bar is adapted to electrically connect to the second terminal of a trailing photovoltaic module in a unit; and
plurality of inter-module rails, each inter-module rail being produced on the carrier substrate via the roll-to-roll process,
connected to at least one of the first and second module terminals of one or more of the plurality of printed photovoltaic modules, and
printed with a linkable gap such that the photovoltaic modules are initially disconnected from one another; and
a conductive paste, a conductive ink or a conductive tape dispensed over the respective linkable gap of one or more of the inter-module rails after the one or more of the inter-module rails are produced via the roll-to-roll process;
wherein the plurality of inter-module rails isare at least partly located between adjacent photovoltaic modules in the longitudinal direction, one photovoltaic module being selectively connectable to an adjacent photovoltaic module in series by application of the conductive paste, the conductive ink or the conductive tape over the respective linkable gap, at least when an electrical connection to the first or second bus bar is established through the first or second terminal,
wherein the plurality of inter-module rails and gaps or connections between the first and second module terminals and the first and second printed bus bars define a plurality of selectively configurable junctions at predetermined locations on the carrier substrate.

14. The printed solar film according to claim 13, wherein each photovoltaic cell comprises a first and second cell electrode, wherein the first electrode has a positive electrical potential relative to said second cell electrode and wherein the first cell electrode of the leading photovoltaic cell in the series forms the first module terminal and the second cell electrode of the trailing photovoltaic cell in the series forms the second module terminal.

15. The printed solar film according to claim 13, wherein the solar film is printed on demand to provide a selected electrical voltage or current by: selecting the number of cells in a module; and/or selecting the number of modules in a unit.

16. The printed solar film according to claim 13, wherein each photovoltaic module includes more than eight photovoltaic cells electrically connected in series.

17. The printed solar film according to claim 13, wherein each photovoltaic module is oriented perpendicularly to the first and second bus bars.

* * * * *